United States Patent [19]

Nasu

[11] Patent Number: 5,442,301
[45] Date of Patent: Aug. 15, 1995

[54] LSI TEST CIRCUIT

[75] Inventor: Yasuyuki Nasu, Tokyo, Japan

[73] Assignee: NEC Corporation, Tokyo, Japan

[21] Appl. No.: 253,328

[22] Filed: Jun. 3, 1994

Related U.S. Application Data

[63] Continuation of Ser. No. 1,401, Jan. 7, 1993, abandoned, which is a continuation of Ser. No. 841,273, Feb. 26, 1992, abandoned, which is a continuation of Ser. No. 641,699, Jan. 16, 1991, abandoned.

[30] Foreign Application Priority Data

Jan. 17, 1990 [JP] Japan .................................. 2-8805

[51] Int. Cl.$^6$ ............................................ G01R 31/28
[52] U.S. Cl. .................................. 324/763; 324/158.1;
324/537; 371/22.5
[58] Field of Search .................... 324/158.1, 73.1, 537,
324/538, 763; 371/22.3, 22.6, 25.1, 22.5

[56] References Cited

U.S. PATENT DOCUMENTS

| | | | |
|---|---|---|---|
| 3,961,254 | 6/1976 | Cavaliere et al. | 371/22.3 |
| 4,220,917 | 9/1980 | McMahon, Jr. | 324/537 |
| 4,241,307 | 12/1980 | Hong | 371/22.1 |
| 4,286,173 | 8/1981 | Oka et al. | 307/440 |
| 4,546,472 | 10/1985 | Volk et al. | 371/27 |
| 4,556,840 | 12/1985 | Russell | 371/22.6 |
| 4,583,179 | 4/1986 | Horii et al. | 371/22.6 |
| 4,682,331 | 7/1987 | Mori | 371/25.1 |
| 4,782,283 | 11/1988 | Zasio | 324/158 R |
| 4,837,765 | 6/1989 | Suzuki | 371/25.1 |
| 4,862,072 | 8/1989 | Harris et al. | 371/25.1 |
| 4,929,889 | 5/1990 | Seiler et al. | 371/25.1 |
| 4,949,341 | 8/1990 | Lopez et al. | 371/25.1 |
| 4,974,226 | 11/1990 | Fujimori et al. | 371/22.6 |
| 5,014,226 | 5/1991 | Horstmann et al. | 371/22.6 |

FOREIGN PATENT DOCUMENTS 0008380  3/1980  European Pat. Off. .

OTHER PUBLICATIONS

French Search Report for Application No. FR 9100438.
IBM Technical Disclosure Bulletin, vol. 31, No. 3, Aug. 1988, New York, US pp. 1–3, "Automatic Test Method for LSI Module".
IBM Technical Disclosure Bulletin, vol. 30, No. 7, Dec. 1987, New York US, pp. 188–190, "New Approach to Level Sensitive Scan Design Testing".

Primary Examiner—Ernest F. Karlsen
Attorney, Agent, or Firm—Burns, Doane, Swecker & Mathis

[57] ABSTRACT

A LSI test circuit includes an exclusive-OR gate and an external output pin. The exclusive-OR gate receives at least part of the values supplied from external input pins of a LSI. The output of the exclusive-OR gate is connected to the external output pin.

1 Claim, 2 Drawing Sheets

*INCOINCIDENCE

| PATTERN NUMBER | INPUT PIN NUMBER | | | | | | | | | OUTPUT VALUE WHEN CONNECTION DEFECTS OCCUR AT INPUT PINS 5 AND 7 |
|---|---|---|---|---|---|---|---|---|---|---|
| | INPUT PATTERN VALUE | | | | | | | | | |
| | 1 | 2 | 3 | 4 | 5 | 6 | 7 | 8 | | |
| 1 | 0 | 0 | 0 | 0 | 0 | 0 | 0 | 0 | 0 | 0 |
| 2 | 1 | 0 | 0 | 0 | 0 | 0 | 0 | 0 | 1 | 1 |
| 3 | 1 | 1 | 0 | 0 | 0 | 0 | 0 | 0 | 0 | 0 |
| 4 | 1 | 1 | 1 | 0 | 0 | 0 | 0 | 0 | 1 | 1 |
| 5 | 1 | 1 | 1 | 1 | 0 | 0 | 0 | 0 | 0 | 0 |
| 6 | 1 | 1 | 1 | 1 | 1 | 0 | 0 | 0 | 1 | 0* |
| 7 | 1 | 1 | 1 | 1 | 1 | 1 | 0 | 0 | 0 | 1* |
| 8 | 1 | 1 | 1 | 1 | 1 | 1 | 1 | 0 | 1 | 1 |
| 9 | 1 | 1 | 1 | 1 | 1 | 1 | 1 | 1 | 0 | 0 |

FIG.2

LSI TEST CIRCUIT

This application is a continuation of application Ser. No. 08/001,401, filed Jan. 7, 1993, now abandoned, which is a continuation of application Ser. No. 07/841,273, filed Feb. 26, 1992, now abandoned, which is a continuation of application Ser. No. 07/641,699, filed Jan. 16, 1991, now abandoned.

BACKGROUND OF THE INVENTION

The present invention relates to a LSI test circuit and, more particularly, to a LSI circuit for checking connection between external connection pins of a LSI, mounted on a printed board, and a wiring pattern of the printed board.

After a LSI is mounted on a printed board, the following conventional methods have been used to check whether a wiring pattern on the board is electrically connected to the external connection pins of the LSI without defects: a method of checking connection by visual inspection; a method of checking connection by forming through paths in a LSI from input pins to an output pin and testing whether a pattern given to the input pins appears at the output pin without changes; and a method of checking connection by putting a probe, having one-to-one correspondence with a net, on a surface, of a board, opposite to its LSI-mounting surface, applying a test pattern to input pins, and checking a pattern appearing at an output pin (in-circuit test).

Of the above-mentioned conventional methods of checking soldering, in the checking method based on visual inspection, oversight and misreading tend to occur, and a large number of steps are required to check current LSIs each having 500 pins or more. In the method of forming through paths, since a selector for switching a through path and an internal path is required at an output portion, the hardware amount is undesirably increased. In the in-circuit test method, as an internal circuit becomes more complicated with an increase in integration of a current LSI, it is difficult to identify a correlation between a test pattern given to certain input pins and a pattern appearing at an output pin. More specifically, if an improper output pattern is obtained, in order to determine whether it is caused by a defect in soldering of input/output pins or by a defect in the internal circuit, an enormous amount of test patterns are required, resulting in difficulty in analysis.

SUMMARY OF THE INVENTION

It is an object of the present invention to provide a LSI test circuit which can decrease the number of test patterns and can shorten a test time.

In order to achieve the above object, according to the present invention, there is provided a LSI test circuit comprising an exclusive-OR gate for receiving at least part of values supplied from external input pins of a LSI, and an external output pin to which an output of the exclusive-OR gate is connected.

BRIEF DESCRIPTION OF THE DRAWINGS

FIG. 2 is a view for explaining an operation of the embodiment in FIG. 1; and

DESCRIPTION OF THE PREFERRED EMBODIMENT

Embodiments of the present invention will be described below with reference to the accompanying drawings.

Figure 1:
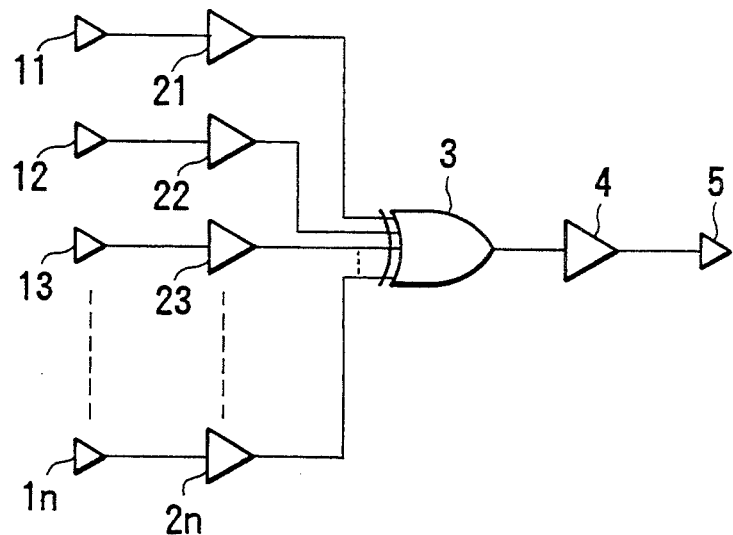
FIG. 1 is a circuit diagram of an embodiment of the present invention.

FIG. 1 shows an embodiment of the present invention. The embodiment in FIG. 1 comprises input pins 11 to in of a LSI, input buffers 21 to 2n arranged inside the LSI and respectively connected to the input pins 11 to 1n, an exclusive-OR gate 3 connected to the input buffers 21 to 2n, and an output pin 5 connected to the output buffer 4.

When a certain test pattern is supplied to a net of a printed board to which the input pins 11 to in are soldered, the test pattern pulses are exclusive-ORed by the exclusive-OR gate 3 through the input buffers 21 to 2n. The result is output from the output pin 5. The output value is then detected from the net on the printed board, to which the output pin 5 is soldered, by using a tester.

FIG. 2 shows a table for explaining a test operation to be performed when the number of input pins is eight, and buffers having pull-up resistors are used as input buffers. Referring to FIG. 2, if soldering defects occur at the fifth and seventh input pins, since the input buffer having the pull-up resistors are used, the fifth and seventh input buffers output "1" regardless of patterns supplied thereto. If, therefore, eight inputs are exclusive-ORed, expected output values do not coincide with actual output values when input patterns having pattern numbers 6 and 7 are supplied.

By using a circuit for exclusive-ORing all inputs to a LSI and outputting the resultant values in this manner, soldering defects between the input pins of the LSI and a printed board can be detected by using only a number of test patterns corresponding to "(the number of input pins)+1."

Figure 3:
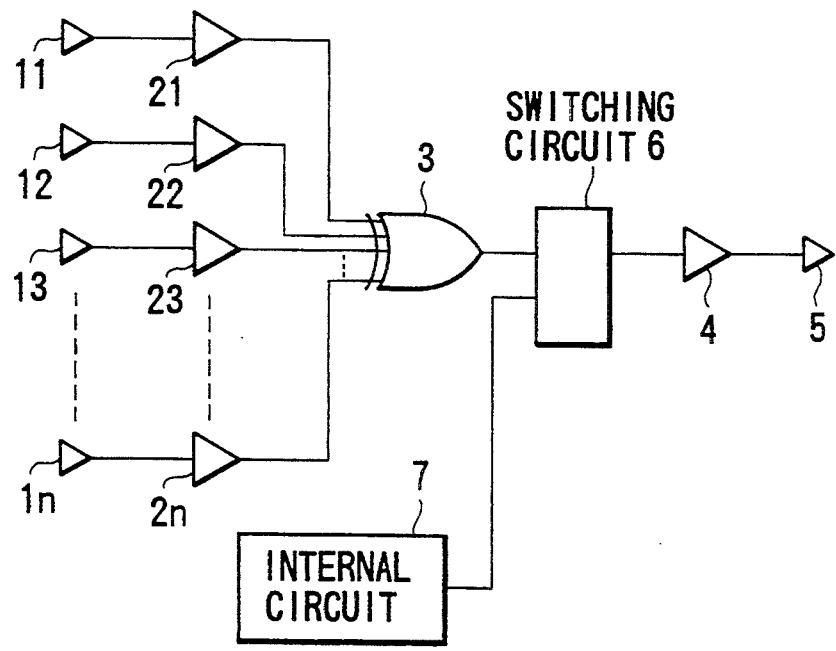
FIG. 3 is a circuit diagram of another embodiment of the present invention.

FIG. 3 shows another embodiment of the present invention. The embodiment in FIG. 3 includes a switching circuit 6 arranged between the exclusive-OR gate 3 and the output buffer 4 in the embodiment shown in FIG. 1. The switching circuit 6 normally outputs values supplied from an internal circuit 7. In the test mode, however, the switching circuit 6 outputs values supplied from an exclusive-OR gate 3. With this arrangement, an output pin exclusively used in the test mode need not be used.

As has been described above, according to the present invention, the number of test patterns required to detect soldering defects between the input pins of a LSI and a printed board can be decreased, thereby shortening the test time.

What is claimed is:

1. A method of testing connection pins of an integrated circuit mounted on the printed circuit board, wherein a total integer number of n input pins are connection through a plurality of input buffers having a plurality of pull-up resistors to an exclusive-OR gate to provide an exclusive-OR output of the input buffers, said method comprising:

a first detecting step for detecting whether or not an output from said exclusive-OR gate is coincident with an expected value, said output being obtained by applying a binary zero input pattern to all of said input pins, a second detecting step for detecting whether or not an output from said exclusive-OR output is coincident with an expected value, said output being obtained by applying a binary one input pattern to only a first input pin of said total input pins and a binary zero input pattern to the rest of the input pins, and third through (n+1)-th detecting steps for sequentially detecting input pins for detecting whether or not said outputs from said exclusive-OR gate are coincident with expected values, said outputs being obtained by applying a binary one input pattern to selected first through i-th input pin (i being an integer) of said total number n input pins and a binary zero input pattern to the rest of the input pins, said detection indicating defects at (j-1)-th and k-th input pins (j and k being integers) when non-coincident outputs of said exclusive-OR gate are continuously detected from said j-th to k-th step.

* * * * *